United States Patent
Bertness et al.

(10) Patent No.: US 7,106,070 B2
(45) Date of Patent: Sep. 12, 2006

(54) BROAD-BAND LOW-INDUCTANCE CABLES FOR MAKING KELVIN CONNECTIONS TO ELECTROCHEMICAL CELLS AND BATTERIES

(75) Inventors: Kevin I. Bertness, Batavia, IL (US); Keith S. Champlin, Minneapolis, MN (US)

(73) Assignee: Midtronics, Inc., Willowbrook, IL (US)

( * ) Notice: Subject to any disclaimer, the term of this patent is extended or adjusted under 35 U.S.C. 154(b) by 0 days.

(21) Appl. No.: 10/896,835

(22) Filed: Jul. 22, 2004

(65) Prior Publication Data

US 2006/0017447 A1 Jan. 26, 2006

(51) Int. Cl.
  *G01R 31/04* (2006.01)
  *G01R 27/28* (2006.01)
(52) U.S. Cl. ........................ 324/538; 324/628
(58) Field of Classification Search ........ 324/538, 324/628; 333/12
  See application file for complete search history.

(56) References Cited

U.S. PATENT DOCUMENTS

| | | | |
|---|---|---|---|
| 2,000,665 A | 5/1935 | Neal | 439/440 |
| 2,514,745 A | 7/1950 | Dalzell | 324/115 |
| 3,356,936 A | 12/1967 | Smith | 324/429 |
| 3,562,634 A | 2/1971 | Latner | 324/427 |
| 3,593,099 A | 7/1971 | Scholl | 320/127 |
| 3,607,673 A | 9/1971 | Seyl | 324/425 |
| 3,652,341 A | 3/1972 | Halsall et al. | 20/623.2 |
| 3,676,770 A | 7/1972 | Sharaf et al. | 324/430 |
| 3,729,989 A | 5/1973 | Little | 73/862.192 |
| 3,750,011 A | 7/1973 | Kreps | 324/430 |

(Continued)

FOREIGN PATENT DOCUMENTS

DE  29 26 716 B1  1/1981

(Continued)

OTHER PUBLICATIONS

Wikipedia Online Encyclopedia, INDUCTANCE, 2005, http://en.wikipedia.org/wiki/Inductance, pp. 1-5, Mutual Inductance pp. 3,4.*

(Continued)

*Primary Examiner*—Diane Lee
*Assistant Examiner*—John Zhu
(74) *Attorney, Agent, or Firm*—Westmaln, Champlin & Kelly, P.A.

(57) ABSTRACT

A broad-band technique for reducing the distributed inductance of a four-conductor Kelvin cable is disclosed. A special inductance-canceling cable section is connected in tandem with the cable section contacting the cell/battery. Connections between the two cable sections are transposed such that conductors in each conductor pair of the canceling section connect to current-carrying and voltage-sensing conductors from different conductor pairs in the contacting section. The canceling section thereby exhibits a distributed negative mutual inductance between its current-carrying and voltage-sensing conductors that can effectively cancel the distributed positive mutual inductance introduced by the contacting section.

In one embodiment, conductor pairs comprise pairs of insulated wires which may be twisted together. In other disclosed embodiments, conductor pairs comprise shielded coaxial cables.

26 Claims, 5 Drawing Sheets

U.S. PATENT DOCUMENTS

| | | | |
|---|---|---|---|
| 3,753,094 A | 8/1973 | Furuishi et al. | 324/430 |
| 3,796,124 A | 3/1974 | Crosa | 411/521 |
| 3,808,522 A | 4/1974 | Sharaf | 324/430 |
| 3,811,089 A | 5/1974 | Strezelewicz | 324/170 |
| 3,873,911 A | 3/1975 | Champlin | 324/430 |
| 3,876,931 A | 4/1975 | Godshalk | 324/429 |
| 3,886,443 A | 5/1975 | Miyakawa et al. | 324/426 |
| 3,889,248 A | 6/1975 | Ritter | 340/636 |
| 3,906,329 A | 9/1975 | Bader | 320/134 |
| 3,909,708 A | 9/1975 | Champlin | 324/431 |
| 3,936,744 A | 2/1976 | Perlmutter | 324/772 |
| 3,946,299 A | 3/1976 | Christianson et al. | 320/430 |
| 3,947,757 A | 3/1976 | Grube et al. | 324/416 |
| 3,969,667 A | 7/1976 | McWilliams | 324/427 |
| 3,979,664 A | 9/1976 | Harris | 324/397 |
| 3,984,762 A | 10/1976 | Dowgiallo, Jr. | 324/430 |
| 3,984,768 A | 10/1976 | Staples | 324/712 |
| 3,989,544 A | 11/1976 | Santo | 429/65 |
| 4,008,619 A | 2/1977 | Alcaide et al. | 73/724 |
| 4,023,882 A | 5/1977 | Pettersson | 439/426 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/434 |
| 4,056,764 A | 11/1977 | Endo et al. | 320/101 |
| 4,070,624 A | 1/1978 | Taylor | 324/772 |
| 4,086,531 A | 4/1978 | Bernier | 324/772 |
| 4,112,351 A | 9/1978 | Back et al. | 324/380 |
| 4,114,083 A | 9/1978 | Benham et al. | 320/150 |
| 4,126,874 A | 11/1978 | Suzuki et al. | 396/301 |
| 4,160,916 A | 7/1979 | Papasideris | 307/10.6 |
| 4,178,546 A | 12/1979 | Hulls et al. | 324/772 |
| 4,193,025 A | 3/1980 | Frailing et al. | 324/427 |
| 4,207,611 A | 6/1980 | Gordon | 324/503 |
| 4,217,645 A | 8/1980 | Barry et al. | 702/63 |
| 4,280,457 A | 7/1981 | Bloxham | 123/198 |
| 4,297,639 A | 10/1981 | Branham | 324/429 |
| 4,315,204 A | 2/1982 | Sievers et al. | 322/28 |
| 4,316,185 A | 2/1982 | Watrous et al. | 320/116 |
| 4,322,685 A | 3/1982 | Frailing et al. | 324/429 |
| 4,351,405 A | 9/1982 | Fields et al. | 180/65.2 |
| 4,352,067 A | 9/1982 | Ottone | 324/434 |
| 4,360,780 A | 11/1982 | Skutch, Jr. | 324/437 |
| 4,361,809 A | 11/1982 | Bil et al. | 324/426 |
| 4,363,407 A | 12/1982 | Barkler et al. | 209/3.3 |
| 4,369,407 A | 1/1983 | Korbell | 324/416 |
| 4,379,989 A | 4/1983 | Kurz et al. | 320/165 |
| 4,379,990 A | 4/1983 | Sievers et al. | 322/99 |
| 4,385,269 A | 5/1983 | Aspinwall et al. | 320/129 |
| 4,390,828 A | 6/1983 | Converse et al. | 320/153 |
| 4,392,101 A | 7/1983 | Saar et al. | 320/156 |
| 4,396,880 A | 8/1983 | Windebank | 320/156 |
| 4,408,157 A | 10/1983 | Beaubien | 324/712 |
| 4,412,169 A | 10/1983 | Dell 'Orto | 320/123 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,459,548 A | 7/1984 | Lentz et al. | 324/772 |
| 4,514,694 A | 4/1985 | Finger | 324/429 |
| 4,520,353 A | 5/1985 | McAuliffe | 340/636 |
| 4,564,798 A | 1/1986 | Young | 320/103 |
| 4,620,767 A | 11/1986 | Woolf | 439/217 |
| 4,633,418 A | 12/1986 | Bishop | 702/63 |
| 4,659,977 A | 4/1987 | Kissel et al. | 320/150 |
| 4,663,580 A | 5/1987 | Wortman | 320/153 |
| 4,665,370 A | 5/1987 | Holland | 324/429 |
| 4,667,143 A | 5/1987 | Cooper et al. | 320/153 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/165 |
| 4,686,442 A | 8/1987 | Radomski | 320/123 |
| 4,697,134 A | 9/1987 | Burkum et al. | 320/134 |
| 4,707,795 A | 11/1987 | Alber et al. | 702/63 |
| 4,709,202 A | 11/1987 | Koenck et al. | 320/112 |
| 4,710,861 A | 12/1987 | Kanner | 363/46 |
| 4,719,428 A | 1/1988 | Liebermann | 324/436 |
| 4,723,656 A | 2/1988 | Kiernan et al. | 206/705 |
| 4,743,855 A | 5/1988 | Randin et al. | 324/430 |
| 4,745,349 A | 5/1988 | Palanisamy et al. | 320/125 |
| 4,816,768 A | 3/1989 | Champlin | 324/428 |
| 4,820,966 A | 4/1989 | Fridman | 320/116 |
| 4,825,170 A | 4/1989 | Champlin | 324/436 |
| 4,847,547 A | 7/1989 | Eng, Jr. et al. | 320/153 |
| 4,849,700 A | 7/1989 | Morioka et al. | 324/427 |
| 4,874,679 A | 10/1989 | Miyagawa | 429/91 |
| 4,876,495 A | 10/1989 | Palanisamy et al. | 320/106 |
| 4,881,038 A | 11/1989 | Champlin | 324/426 |
| 4,888,716 A | 12/1989 | Ueno | 702/63 |
| 4,912,416 A | 3/1990 | Champlin | 324/430 |
| 4,913,116 A | 4/1990 | Katogi et al. | 123/406.32 |
| 4,926,330 A | 5/1990 | Abe et al. | 364/424.03 |
| 4,929,931 A | 5/1990 | McCuen | 340/636 |
| 4,931,738 A | 6/1990 | MacIntyre et al. | 324/435 |
| 4,933,845 A | 6/1990 | Hayes | 710/104 |
| 4,934,957 A | 6/1990 | Bellusci | 439/504 |
| 4,937,528 A | 6/1990 | Palanisamy | 324/430 |
| 4,947,124 A | 8/1990 | Hauser | 324/430 |
| 4,949,046 A | 8/1990 | Seyfang | 324/427 |
| 4,956,597 A | 9/1990 | Heavey et al. | 320/129 |
| 4,968,941 A | 11/1990 | Rogers | 324/428 |
| 4,968,942 A | 11/1990 | Palanisamy | 324/430 |
| 5,004,979 A | 4/1991 | Marino et al. | 324/160 |
| 5,032,825 A | 7/1991 | Xuznicki | 340/636 |
| 5,037,778 A | 8/1991 | Stark et al. | 437/216 |
| 5,047,722 A | 9/1991 | Wurst et al. | 324/430 |
| 5,081,565 A | 1/1992 | Nabha et al. | 362/465 |
| 5,087,881 A | 2/1992 | Peacock | 324/378 |
| 5,095,223 A | 3/1992 | Thomas | 307/110 |
| 5,108,320 A | 4/1992 | Kimber | 439/883 |
| 5,126,675 A | 6/1992 | Yang | 324/435 |
| 5,140,269 A | 8/1992 | Champlin | 324/433 |
| 5,144,218 A | 9/1992 | Bosscha | 320/139 |
| 5,144,248 A | 9/1992 | Alexandres et al. | 324/428 |
| 5,159,272 A | 10/1992 | Rao et al. | 324/429 |
| 5,160,881 A | 11/1992 | Schramm et al. | 322/7 |
| 5,170,124 A | 12/1992 | Blair et al. | 324/434 |
| 5,179,335 A | 1/1993 | Nor | 320/159 |
| 5,194,799 A | 3/1993 | Tomantschger | 320/103 |
| 5,204,611 A | 4/1993 | Nor et al. | 320/145 |
| 5,214,370 A | 5/1993 | Harm et al. | 320/152 |
| 5,214,385 A | 5/1993 | Gabriel et al. | 324/434 |
| 5,241,275 A | 8/1993 | Fang | 324/430 |
| 5,254,952 A | 10/1993 | Salley et al. | 324/429 |
| 5,266,880 A | 11/1993 | Newland | 320/125 |
| 5,281,919 A | 1/1994 | Palanisamy | 324/427 |
| 5,281,920 A | 1/1994 | Wurst | 324/430 |
| 5,295,078 A | 3/1994 | Stich et al. | 320/136 |
| 5,298,797 A | 3/1994 | Redl | 327/387 |
| 5,300,874 A | 4/1994 | Shimamoto et al. | 320/106 |
| 5,302,902 A | 4/1994 | Groehl | 324/434 |
| 5,313,152 A | 5/1994 | Wozniak et al. | 320/118 |
| 5,315,287 A | 5/1994 | Sol | 340/455 |
| 5,321,626 A | 6/1994 | Palladino | 702/63 |
| 5,321,627 A | 6/1994 | Reher | 364/483 |
| 5,323,337 A | 6/1994 | Wilson et al. | 364/574 |
| 5,325,041 A | 6/1994 | Briggs | 320/149 |
| 5,331,268 A | 7/1994 | Patino et al. | 320/158 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/147 |
| 5,343,380 A | 8/1994 | Champlin | 363/46 |
| 5,347,163 A | 9/1994 | Yoshimura | 307/66 |
| 5,352,968 A | 10/1994 | Reni et al. | 320/136 |
| 5,365,160 A | 11/1994 | Leppo et al. | 320/160 |

| | | | | | | | |
|---|---|---|---|---|---|---|---|
| 5,365,453 | A | 11/1994 | Startup et al. ............... 320/136 | 5,773,978 | A | 6/1998 | Becker ........................ 324/430 |
| 5,369,364 | A | 11/1994 | Renirie et al. ............... 324/430 | 5,780,974 | A | 7/1998 | Pabla et al. ................... 315/82 |
| 5,381,096 | A | 1/1995 | Hirzel ......................... 324/427 | 5,780,980 | A | 7/1998 | Naito .......................... 318/139 |
| 5,410,754 | A | 4/1995 | Klotzbach et al. ........... 370/466 | 5,789,899 | A | 8/1998 | van Phuoc et al. .......... 320/112 |
| 5,412,308 | A | 5/1995 | Brown ........................ 323/267 | 5,793,359 | A | 8/1998 | Ushikubo .................... 345/169 |
| 5,412,323 | A | 5/1995 | Kato et al. ................... 324/429 | 5,796,239 | A | 8/1998 | van Phuoc et al. .......... 320/107 |
| 5,426,371 | A | 6/1995 | Salley et al. ................. 324/429 | 5,808,469 | A | 9/1998 | Kopera ........................ 324/434 |
| 5,426,416 | A | 6/1995 | Jefferies et al. ............. 340/664 | 5,818,234 | A | 10/1998 | McKinnon ................... 324/433 |
| 5,432,025 | A | 7/1995 | Cox ............................ 429/65 | 5,821,756 | A | 10/1998 | McShane et al. ............ 324/430 |
| 5,432,426 | A | 7/1995 | Yoshida ....................... 320/160 | 5,821,757 | A * | 10/1998 | Alvarez et al. .............. 324/434 |
| 5,434,495 | A | 7/1995 | Toko ........................... 320/135 | 5,825,174 | A | 10/1998 | Parker ......................... 324/106 |
| 5,435,185 | A | 7/1995 | Eagan .......................... 73/587 | 5,831,435 | A | 11/1998 | Troy ........................... 324/426 |
| 5,442,274 | A | 8/1995 | Tamai ......................... 320/146 | 5,850,113 | A | 12/1998 | Weimer et al. .............. 307/125 |
| 5,445,026 | A | 8/1995 | Eagan .......................... 73/591 | 5,862,515 | A | 1/1999 | Kobayashi et al. ........... 702/63 |
| 5,449,996 | A | 9/1995 | Matsumoto et al. ......... 320/148 | 5,865,638 | A | 2/1999 | Trafton ........................ 439/288 |
| 5,449,997 | A | 9/1995 | Gilmore et al. .............. 320/148 | 5,872,443 | A | 2/1999 | Williamson .................. 320/160 |
| 5,451,881 | A | 9/1995 | Finger ......................... 324/433 | 5,872,453 | A | 2/1999 | Shimoyama et al. ........ 324/431 |
| 5,453,027 | A | 9/1995 | Buell et al. .................. 439/433 | 5,895,440 | A | 4/1999 | Proctor et al. ................ 702/63 |
| 5,457,377 | A | 10/1995 | Jonsson ............... 320/DIG. 21 | 5,912,534 | A | 6/1999 | Benedict ...................... 315/82 |
| 5,469,043 | A | 11/1995 | Cherng et al. ............... 320/161 | 5,914,605 | A | 6/1999 | Bertness ...................... 324/430 |
| 5,485,090 | A | 1/1996 | Stephens ...................... 324/433 | 5,927,938 | A | 7/1999 | Hammerslag ................ 414/809 |
| 5,488,300 | A | 1/1996 | Jamieson ...................... 324/432 | 5,929,609 | A | 7/1999 | Joy et al. ..................... 322/25 |
| 5,519,383 | A | 5/1996 | De La Rosa ................. 340/636 | 5,939,855 | A | 8/1999 | Proctor et al. ............... 320/104 |
| 5,528,148 | A | 6/1996 | Rogers ......................... 320/137 | 5,939,861 | A | 8/1999 | Joko et al. ................... 320/122 |
| 5,537,967 | A | 7/1996 | Tashiro et al. ............... 123/192.1 | 5,945,829 | A | 8/1999 | Bertness ...................... 324/430 |
| 5,541,489 | A | 7/1996 | Dunstan ....................... 320/134 | 5,951,229 | A | 9/1999 | Hammerslag ................ 414/398 |
| 5,546,317 | A | 8/1996 | Andrieu ....................... 702/63 | 5,961,561 | A | 10/1999 | Wakefield, II ................ 701/29 |
| 5,548,273 | A | 8/1996 | Nicol et al. .................. 340/439 | 5,961,604 | A | 10/1999 | Anderson et al. ............ 709/229 |
| 5,550,485 | A | 8/1996 | Falk ............................ 324/772 | 5,969,625 | A | 10/1999 | Russo ..................... 340/636.19 |
| 5,561,380 | A | 10/1996 | Sway-Tin et al. ............ 324/509 | 5,978,805 | A | 11/1999 | Carson ......................... 707/10 |
| 5,562,501 | A | 10/1996 | Kinoshita et al. ............ 439/852 | 5,982,138 | A | 11/1999 | Krieger ........................ 320/105 |
| 5,563,496 | A | 10/1996 | McClure ...................... 320/128 | 6,002,238 | A | 12/1999 | Champlin .................... 320/134 |
| 5,572,136 | A | 11/1996 | Champlin .................... 324/426 | 6,005,759 | A | 12/1999 | Hart et al. .................... 361/66 |
| 5,574,355 | A | 11/1996 | McShane et al. ............. 320/161 | 6,008,652 | A | 12/1999 | Theofanopoulos et al. . 324/434 |
| 5,578,915 | A | 11/1996 | Crouch, Jr. et al. .......... 324/428 | 6,009,369 | A | 12/1999 | Boisvert et al. .............. 701/99 |
| 5,583,416 | A | 12/1996 | Klang .......................... 320/160 | 6,016,047 | A | 1/2000 | Notten et al. ................. 320/137 |
| 5,585,728 | A | 12/1996 | Champlin .................... 324/427 | 6,031,354 | A | 2/2000 | Wiley et al. .................. 320/116 |
| 5,589,757 | A | 12/1996 | Klang .......................... 320/160 | 6,031,368 | A | 2/2000 | Klippel et al. ............... 324/133 |
| 5,592,093 | A | 1/1997 | Klingbiel ..................... 324/426 | 6,037,751 | A | 3/2000 | Klang .......................... 320/160 |
| 5,592,094 | A | 1/1997 | Ichikawa ...................... 324/427 | 6,037,777 | A | 3/2000 | Champlin .................... 324/430 |
| 5,596,260 | A | 1/1997 | Moravec et al. ............. 320/135 | 6,037,778 | A | 3/2000 | Makhija ....................... 324/433 |
| 5,598,098 | A | 1/1997 | Champlin .................... 324/430 | 6,046,514 | A | 4/2000 | Rouillard et al. ............. 307/77 |
| 5,602,462 | A | 2/1997 | Stich et al. ................... 323/258 | 6,051,976 | A | 4/2000 | Bertness ...................... 324/426 |
| 5,606,242 | A | 2/1997 | Hull et al. .................... 320/106 | 6,055,468 | A | 4/2000 | Kaman et al. ................ 701/29 |
| 5,614,788 | A | 3/1997 | Mullins et al. ............... 315/82 | 6,061,638 | A | 5/2000 | Joyce ........................... 702/63 |
| 5,621,298 | A | 4/1997 | Harvey ........................ 320/134 | 6,064,372 | A | 5/2000 | Kahkoska .................... 345/173 |
| 5,633,985 | A | 5/1997 | Severson et al. ............. 704/267 | 6,072,299 | A | 6/2000 | Kurie et al. .................. 320/112 |
| 5,637,978 | A | 6/1997 | Kellett et al. ................. 320/104 | 6,072,300 | A | 6/2000 | Tsuji ........................... 320/116 |
| 5,642,031 | A | 6/1997 | Brotto ......................... 320/152 | 6,081,098 | A | 6/2000 | Bertness et al. .............. 320/134 |
| 5,650,937 | A | 7/1997 | Bounaga ...................... 702/6 | 6,081,109 | A | 6/2000 | Seymour et al. ............. 324/127 |
| 5,652,501 | A | 7/1997 | McClure et al. ............. 320/118 | 6,091,238 | A | 7/2000 | McDermott ............... 324/207.2 |
| 5,653,659 | A | 8/1997 | Kunibe et al. ............... 477/111 | 6,091,245 | A | 7/2000 | Bertness ...................... 324/426 |
| 5,654,623 | A | 8/1997 | Shiga et al. .................. 320/106 | 6,094,033 | A | 7/2000 | Ding et al. ................... 320/132 |
| 5,656,920 | A | 8/1997 | Cherng et al. ............... 320/161 | 6,104,167 | A | 8/2000 | Bertness et al. .............. 320/132 |
| 5,661,368 | A | 8/1997 | Deol et al. ................... 315/82 | 6,114,834 | A | 9/2000 | Parise ......................... 320/109 |
| 5,675,234 | A | 10/1997 | Greene ................ 320/DIG. 18 | 6,137,269 | A | 10/2000 | Champlin .................... 320/150 |
| 5,677,077 | A | 10/1997 | Faulk ........................... 429/90 | 6,140,797 | A | 10/2000 | Dunn ........................... 320/105 |
| 5,699,050 | A | 12/1997 | Kanazawa ................... 340/636 | 6,144,185 | A | 11/2000 | Dougherty et al. .......... 320/132 |
| 5,701,089 | A | 12/1997 | Perkins ........................ 324/772 | 6,150,793 | A | 11/2000 | Lesesky et al. .............. 320/104 |
| 5,705,929 | A | 1/1998 | Caravello et al. ............ 324/430 | 6,158,000 | A | 12/2000 | Collins ......................... 713/1 |
| 5,707,015 | A | 1/1998 | Guthrie ........................ 241/120 | 6,161,640 | A | 12/2000 | Yamaguchi .................. 180/65.8 |
| 5,710,503 | A | 1/1998 | Sideris et al. ................ 320/116 | 6,163,156 | A | 12/2000 | Bertness ...................... 324/426 |
| 5,711,648 | A | 1/1998 | Hammerslag ................ 414/800 | 6,167,349 | A | 12/2000 | Alvarez ....................... 702/63 |
| 5,717,336 | A | 2/1998 | Basell et al. ................. 324/430 | 6,172,483 | B1 | 1/2001 | Champlin .................... 320/134 |
| 5,717,937 | A | 2/1998 | Fritz ............................ 320/128 | 6,172,505 | B1 | 1/2001 | Bertness ...................... 324/426 |
| 5,739,667 | A | 4/1998 | Matsuda et al. ............. 320/128 | 6,181,545 | B1 | 1/2001 | Amatucci et al. ............ 361/502 |
| 5,745,044 | A | 4/1998 | Hyatt, Jr. et al. ............ 340/5.23 | 6,211,651 | B1 | 4/2001 | Nemoto ....................... 320/133 |
| 5,747,909 | A | 5/1998 | Syverson et al. ....... 310/156.56 | 6,215,275 | B1 | 4/2001 | Bean ............................ 320/106 |
| 5,747,967 | A | 5/1998 | Muljadi et al. .............. 320/148 | 6,222,342 | B1 | 4/2001 | Eggert et al. ................. 320/105 |
| 5,754,417 | A | 5/1998 | Nicollini ...................... 363/60 | 6,222,369 | B1 | 4/2001 | Champlin .................... 324/430 |
| 5,757,192 | A | 5/1998 | McShane et al. ............ 324/427 | D442,503 | S | 5/2001 | Lundbeck et al. ........... D10/77 |
| 5,760,587 | A | 6/1998 | Harvey ........................ 324/434 | 6,225,808 | B1 | 5/2001 | Varghese et al. ............ 324/426 |
| 5,772,468 | A | 6/1998 | Kowalski et al. ............ 439/506 | 6,236,332 | B1 | 5/2001 | Conkright et al. ........... 340/3.1 |

| | | | |
|---|---|---|---|
| 6,238,253 B1 | 5/2001 | Qualls | 439/759 |
| 6,242,887 B1 | 6/2001 | Burke | 320/104 |
| 6,249,124 B1 | 6/2001 | Bertness | 324/426 |
| 6,250,973 B1 | 6/2001 | Lowery et al. | 439/763 |
| 6,254,438 B1 | 7/2001 | Gaunt | 489/755 |
| 6,259,170 B1 | 7/2001 | Limoge et al. | 307/10.8 |
| 6,259,254 B1 | 7/2001 | Klang | 324/427 |
| 6,262,563 B1 | 7/2001 | Champlin | 320/134 |
| 6,263,268 B1 | 7/2001 | Nathanson | 701/29 |
| 6,275,008 B1 | 8/2001 | Arai et al. | 320/132 |
| 6,294,896 B1 | 9/2001 | Champlin | 320/134 |
| 6,294,897 B1 | 9/2001 | Champlin | 320/153 |
| 6,304,087 B1 | 10/2001 | Bertness | 324/426 |
| 6,307,349 B1 | 10/2001 | Koenck et al. | 320/112 |
| 6,310,481 B1 | 10/2001 | Bertess | 324/430 |
| 6,313,607 B1 | 11/2001 | Champlin | 320/132 |
| 6,313,608 B1 | 11/2001 | Varghese et al. | 32/132 |
| 6,316,914 B1 | 11/2001 | Bertness | 320/134 |
| 6,323,650 B1 | 11/2001 | Bertness et al. | 324/426 |
| 6,329,793 B1 | 12/2001 | Bertness et al. | 320/132 |
| 6,331,762 B1 | 12/2001 | Bertness | 320/134 |
| 6,332,113 B1 | 12/2001 | Bertness | 702/63 |
| 6,346,795 B1 | 2/2002 | Haraguchi et al. | 320/136 |
| 6,347,958 B1 | 2/2002 | Tsai | 439/488 |
| 6,351,102 B1 | 2/2002 | Troy | 320/139 |
| 6,356,042 B1 | 3/2002 | Kahlon et al. | 318/138 |
| 6,359,441 B1 | 3/2002 | Bertness | 324/426 |
| 6,359,442 B1 | 3/2002 | Henningson et al. | 324/426 |
| 6,363,303 B1 | 3/2002 | Bertness | 701/29 |
| RE37,677 E | 4/2002 | Irie | 315/83 |
| 6,384,608 B1 | 5/2002 | Namaky | 324/430 |
| 6,388,448 B1 | 5/2002 | Cervas | 324/426 |
| 6,392,414 B1 | 5/2002 | Bertness | 324/429 |
| 6,396,278 B1 | 5/2002 | Makhija | 324/402 |
| 6,411,098 B1 | 6/2002 | Laletin | 324/436 |
| 6,417,669 B1 | 7/2002 | Champlin | 324/426 |
| 6,424,157 B1 | 7/2002 | Gollomp et al. | 324/426 |
| 6,424,158 B1 | 7/2002 | Klang | 324/433 |
| 6,441,585 B1 | 8/2002 | Bertness | 320/132 |
| 6,445,158 B1 | 9/2002 | Bertness et al. | 320/104 |
| 6,449,726 B1 | 9/2002 | Smith | 713/340 |
| 6,456,045 B1 | 9/2002 | Troy et al. | 320/139 |
| 6,466,025 B1 | 10/2002 | Klang | 324/429 |
| 6,466,026 B1 | 10/2002 | Champlin | 324/430 |
| 6,495,990 B1 | 12/2002 | Champlin | 320/132 |
| 6,526,361 B1 | 2/2003 | Jones et al. | 702/63 |
| 6,531,848 B1 | 3/2003 | Chitsazan et al. | 320/153 |
| 6,534,993 B1 | 3/2003 | Bertness | 324/433 |
| 6,544,078 B1 | 4/2003 | Palmisano et al. | 439/762 |
| 6,556,019 B1 | 4/2003 | Bertness | 324/426 |
| 6,566,883 B1 | 5/2003 | Vonderhaar et al. | 324/426 |
| 6,570,385 B1 | 5/2003 | Roberts et al. | 324/378 |
| 6,586,941 B1 | 7/2003 | Bertness et al. | 324/426 |
| 6,597,150 B1 | 7/2003 | Bertness et al. | 320/104 |
| 6,600,815 B1 | 7/2003 | Walding | 379/93.07 |
| 6,618,644 B1 | 9/2003 | Bean | 700/231 |
| 6,623,314 B1 | 9/2003 | Cox et al. | 439/759 |
| 6,628,011 B1 | 9/2003 | Droppo et al. | 307/43 |
| 6,629,054 B1 | 9/2003 | Makhija et al. | 702/113 |
| 6,667,624 B1 | 12/2003 | Raichle et al. | 324/522 |
| 6,679,212 B1 | 1/2004 | Kelling | 123/179.28 |
| 6,686,542 B1 * | 2/2004 | Zhang | 174/74 R |
| 6,777,945 B1 | 8/2004 | Roberts et al. | 324/426 |
| 6,850,037 B1 | 2/2005 | Bertness | 320/132 |
| 2002/0010558 A1 | 1/2002 | Bertness et al. | 702/63 |
| 2002/0030495 A1 | 3/2002 | Kechmire | 324/427 |
| 2002/0050163 A1 | 5/2002 | Makhija et al. | 73/116 |
| 2002/0171428 A1 | 11/2002 | Bertness | 324/426 |
| 2002/0176010 A1 | 11/2002 | Wallach et al. | 348/362 |
| 2003/0025481 A1 | 2/2003 | Bertness | 324/427 |
| 2003/0036909 A1 | 2/2003 | Kato | 704/275 |
| 2003/0184262 A1 | 10/2003 | Makhija | 320/130 |
| 2003/0184306 A1 | 10/2003 | Bertness et al. | 324/426 |
| 2003/0194672 A1 | 10/2003 | Roberts et al. | 431/196 |
| 2004/0000590 A1 | 1/2004 | Raichle et al. | 235/462.01 |
| 2004/0000891 A1 | 1/2004 | Raichle et al. | 320/107 |
| 2004/0000893 A1 | 1/2004 | Raichle et al. | 320/135 |
| 2004/0000913 A1 | 1/2004 | Raichle et al. | 324/426 |
| 2004/0000915 A1 | 1/2004 | Raichle et al. | 324/522 |
| 2004/0002824 A1 | 1/2004 | Raichle et al. | 702/63 |
| 2004/0002825 A1 | 1/2004 | Raichle et al. | 702/63 |
| 2004/0002836 A1 | 1/2004 | Raichle et al. | 702/188 |
| 2004/0049361 A1 | 3/2004 | Hamdan et al. | 702/115 |
| 2004/0051533 A1 | 3/2004 | Namaky | 324/426 |
| 2004/0054503 A1 | 3/2004 | Namaky | 702/183 |

FOREIGN PATENT DOCUMENTS

| | | |
|---|---|---|
| EP | 0 022 450 A1 | 1/1981 |
| EP | 0 637 754 A1 | 2/1995 |
| EP | 0 772 056 A1 | 5/1997 |
| FR | 2 749 397 | 12/1997 |
| GB | 2029586 A * | 3/1980 |
| GB | 2 088 159 A | 6/1982 |
| GB | 2 246 916 A | 10/1990 |
| GB | 2 387 235 A | 10/2003 |
| JP | 59-17892 | 1/1984 |
| JP | 59-17893 | 1/1984 |
| JP | 59-17894 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04095788 | 3/1992 |
| JP | 04131779 | 5/1992 |
| JP | 04372536 | 12/1992 |
| JP | 5216550 | 8/1993 |
| JP | 7-128414 | 5/1995 |
| JP | 09061505 | 3/1997 |
| JP | 10056744 | 2/1998 |
| JP | 10232273 | 9/1998 |
| JP | 11103503 A | 4/1999 |
| RU | 2089015 C1 | 8/1997 |
| WO | WO 93/22666 | 11/1993 |
| WO | WO 94/05069 | 3/1994 |
| WO | WO 97/44652 | 11/1997 |
| WO | WO 98/04910 | 2/1998 |
| WO | WO 98/58270 | 12/1998 |
| WO | WO 99/23738 | 5/1999 |
| WO | WO 00/16083 | 3/2000 |
| WO | WO 00/62049 | 10/2000 |
| WO | WO 00/67359 | 11/2000 |
| WO | WO 01/59443 | 2/2001 |
| WO | WO 00/16614 A1 | 3/2001 |
| WO | WO 00/16615 A1 | 3/2001 |
| WO | WO 01/51947 | 7/2001 |

OTHER PUBLICATIONS

"Electrochemical Impedance Spectroscopy in Battery Development and Testing", *Batteries International*, Apr. 1997, pp. 59 and 62-63.

"Battery Impedance", by E. Willihnganz et al., *Electrical Engineering*, Sep. 1959, pp. 922-925.

"Determining The End of Battery Life", by S. DeBardelaben, *IEEE*, 1986, pp. 365-368.

"A Look at the Impedance of a Cell", by S. Debardelaben, *IEEE*, 1988, pp. 394-397.

"The Impedance of Electrical Storage Cells", by N.A. Hampson et al., *Journal of Applied Electrochemistry*, 1980, pp. 3-11.

"A Package for Impedance/Admittance Data Analysis", by B. Boukamp, *Solid State Ionics*, 1986, pp. 136-140.

"Precision of Impedance Spectroscopy Estimates of Bulk, Reaction Rate, and Diffusion Parameters", by J. Macdonald et al., *J. Electroanal, Chem.*, 1991, pp. 1-11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131.

IEEE Recommended Practice For Maintenance, Testings, and Replacement of Large Lead Storage Batteries for Generating Stations and Substations, *The Institute of Electrical and Electronics Engineers, Inc., ANSI/IEEE Std.* 450-1987, Mar. 9, 1987, pp. 7-15.

"Field and Laboratory Studies to Assess the State of Health of Valve-Regulated Lead Acid Batteries: Part I Conductance/Capacity Correlation Studies", by D. Feder et al., *IEEE*, Aug. 1992, pp. 218-233.

"Battery Impedance", by E. Willihnganz et al., *Electrical Engineering*, Sep. 1959, pp. 922-925.

"JIS Japanese Industrial Standard-Lead Acid Batteries for Automobiles", *Japanese Standards Association UDC*, 621.355.2:629.113. 006, Nov. 1995.

"Performance of Dry Cells", by C. Hambuechen, Preprint of *Am. Electrochem. Soc.*, Apr. 18-20, 1912, paper No. 19, pp. 1-5.

"A Bridge for Measuring Storage Battery Resistance", by E. Willihncanz, *The Electrochemical Society*, preprint 79-20, Apr. 1941, pp. 253-258.

National Semiconductor Corporation, "High Q Notch Filter", Linear Brief 5, Mar. 1969.

Burr-Brown Corporation, "Design A 60 Hz Notch Filter with the UAF42", Jan. 1994, AB-071, 1994.

National Semiconductor Corporation, "LMF90-4th-Order Elliptic Notch Filter", RRD-B30M115, Dec. 1994.

"Alligator Clips with Wire Penetrators" *J.S. Popper, Inc.* product information, downloaded from http://www.jspopper.com/, undated.

"#12: LM78S40 Simple Switcher DC to DC Converter", *ITM e-Catalog*, downloaded from http://www.pcbcafe.com, undated.

"Simple DC-DC Converts Allows Use of Single Battery", *Electronix Express*, downloaded from http://www.elexp.com/t_dc-dc.htm, undated.

"DC-DC Converter Basics", *Power Designers*, downloaded from http://www.powederdesigners.com/InforWeb.design_center/articles/DC-DC/converter.shtm, undated.

"Notification of Transmittal of The International Search Report or the Declaration", PCT/US02/29461.

"Notification of Transmittal of The International Search Report or the Declaration", PCT/US03/07546.

"Notification of Transmittal of The International Search Report or the Declaration", PCT/US03/06577.

"Notification of Transmittal of The International Search Report or the Declaration", PCT/US03/07837.

"Notification of Transmittal of The International Search Report or the Declaration", PCT/US03/41561.

"Notification of Transmittal of The International Search Report or the Declaration", PCT/US03/27696.

"Programming Training Course, 62-000 Series Smart Engine Analyzer", Testproducts Division, Kalamazoo, Michigan, pp. 1-207, (1984).

"Operators Manual, Modular Computer Analyzer Model MCA 3000", Sun Electric Corporation, Crystal Lake, Illinois, pp. 1-1-14-13, (1991).

"Notification of Transmittal of The International Search Report or the Declaration", PCT/US02/29461.

"Dynamic modelling of lead/acid batteries using impedance spectroscopy for parameter identification", Journal of Power Sources, pp. 69-84, (1997).

"A review of impedance measurements for determination of the state-of-charge or state-of-health of secondary batteries", Journal of Power Sources, pp. 59-69, (1998).

"Improved Impedance Spectroscopy Technique For Status Determination of Production Li/SO$_2$ Batteries" Terrill Atwater et al., pp. 10-113, (1992).

"Search Report Under Section 17" for Great Britain Application No. GB0421447.4.

"Results of Discrete Frequency Immittance Spectroscopy (DFIS) Measurements of Lead Acid Batteries", by K.S. Champlin et al., *Proceedings of 23rd International Teleco Conference* (*INTELEC*), published Oct. 2001, IEE, pp. 433-440.

"Examination Report" from the U.K. Patent Office for U.K. App. No. 0417678.0.

* cited by examiner

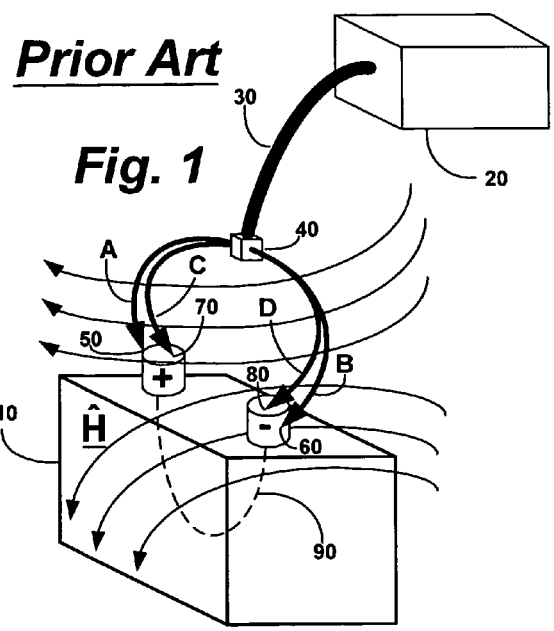
Prior Art
Fig. 1
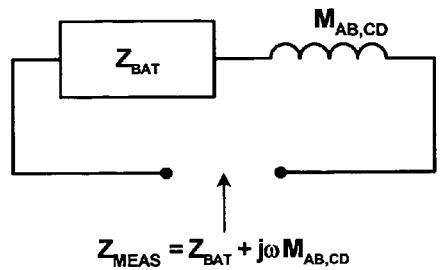
Prior Art
Fig. 3
$Z_{MEAS} = Z_{BAT} + j\omega M_{AB,CD}$
Prior Art Fig. 2
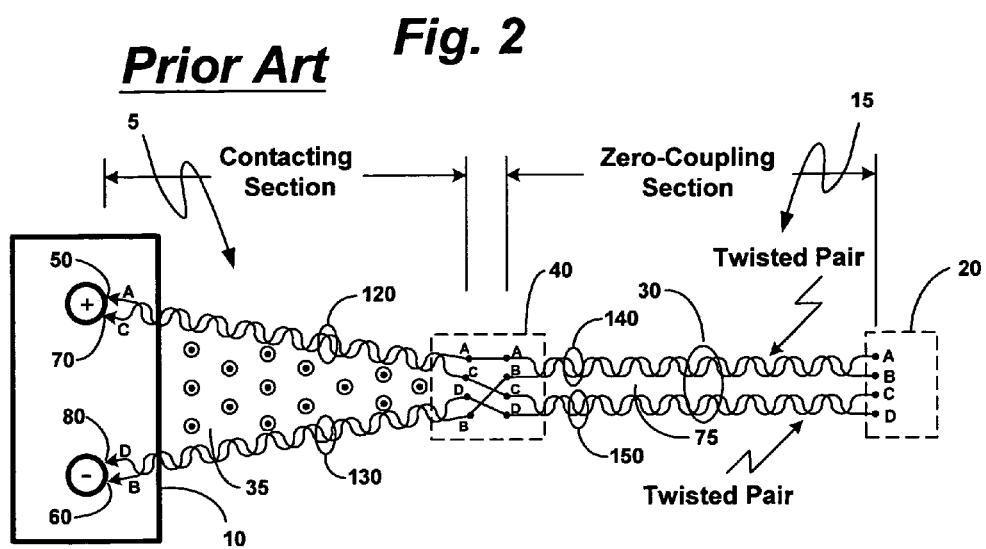

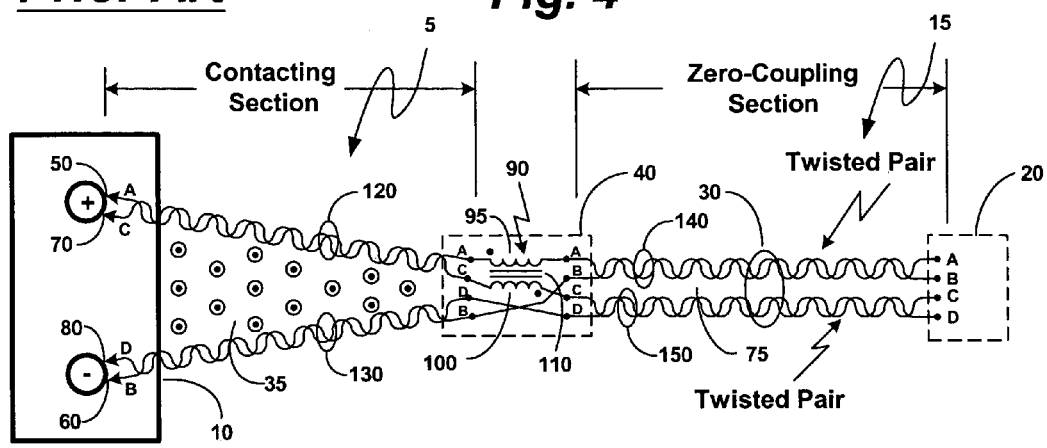
*Fig. 4* — Prior Art
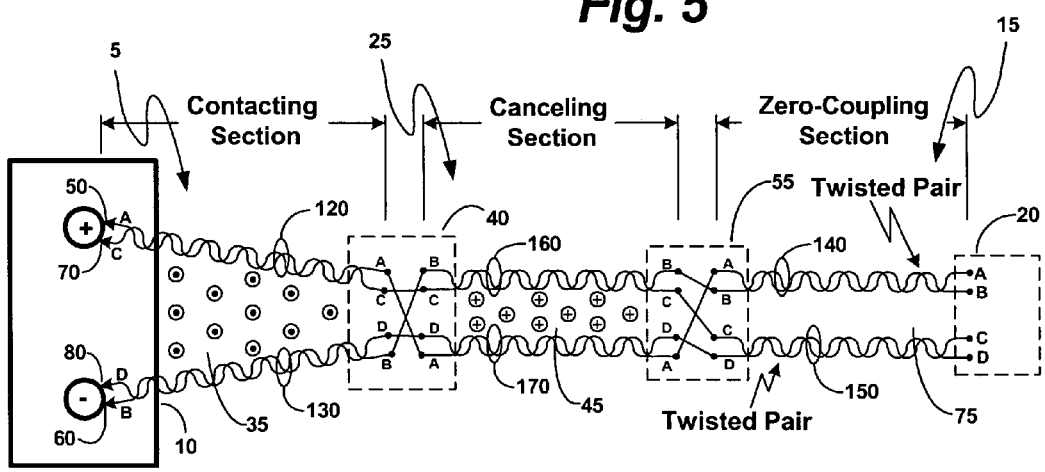
*Fig. 5*

BROAD-BAND LOW-INDUCTANCE CABLES FOR MAKING KELVIN CONNECTIONS TO ELECTROCHEMICAL CELLS AND BATTERIES

BACKGROUND OF THE INVENTION

The present invention relates to measuring a dynamic parameter (e.g., impedance, admittance, resistance, reactance, conductance, susceptance) of an electrochemical cell or battery. More specifically, it relates to reducing the effects of cable inductance upon electrical measurements implemented with time-varying signals through Kelvin (i.e., four-point) connections.

Measuring automotive and standby cell/battery parameters with time-varying signals (i.e., measuring dynamic parameters) are now commonly accepted maintenance and diagnostic procedures. (See, e.g., U.S. Pat. Nos. 5,140,269, 6,262,563, 6,534,993, and 6,623,314). Because of the very small impedances of such cells/batteries, Kelvin connections are routinely employed to reduce the influence of contact and interconnecting cable impedance. Kelvin connections make contact with each cell/battery terminal at two separate contact points—one for current and one for voltage. Apparatus for measuring a two-terminal cell/battery by means of Kelvin connections therefore requires a four-wire interconnecting cable.

Kelvin connections very effectively remove the spurious effects of cable and contact resistances when measurements are made with static currents and voltages. However, when measuring with time-varying signals, distributed mutual inductance between current-carrying and voltage-sensing conductors in the interconnecting cable can introduce significant errors.

Consider FIG. 1. FIG. 1 depicts cell/battery 10 connected to measuring apparatus 20 by means of four-wire cable 30, Y-junction 40, and Kelvin conductors A, B, C, and D. Current-carrying conductors A and B couple to positive and negative cell/battery terminals at contact points 50 and 60, respectively. Voltage-sensing conductors C and D separately couple to positive and negative cell/battery terminals at contact points 70 and 80, respectively. During dynamic measurements, a time-varying current flows through current-carrying conductors A and B and also flows internally between the terminals along an internal current path 90.

FIG. 2 shows the arrangement of conductors employed in the apparatus of FIG. 1. This arrangement was first introduced by Champlin in U.S. Pat. No. 3,873,911 and has been commonly used in dynamic testing of lead-acid storage batteries since 1975. FIG. 2 discloses contacting cable section 5 comprising an A-C pair of insulated wires 120 coupling to the positive cell/battery terminal and a B-D pair of insulated wires 130 coupling to the negative cell/battery terminal. The two conductor pairs are necessarily spaced-apart at the cell/battery terminals but are brought into close proximity at Y-junction 40. These insulated wire pairs may, or may not, be twisted together in section 5. At Y-junction 40 the four wires are re-arranged for connection to zero-coupling cable section 15. Throughout section 15, the A-B current carrying conductors and the C-D voltage-sensing conductors are separately paired and twisted together, pair 140 and pair 150, respectively. The advantage of this pairing and twisting arrangement is that transverse magnetic fields—inherently present in space 35 of cable section 5—are virtually non-existent in space 75 of cable section 15 by virtue of the twisted current-carrying conductors A and B. In addition, the twisted voltage-sensing conductors C and D exhibit negligible coupling to whatever small magnetic fields do exist in space 75. Accordingly, over-all cable inductance is largely confined to contacting cable section 5 with virtually no contribution from zero-coupling cable section 15. Zero-coupling section 15 can therefore be of any length desired for convenience.

Because of the necessity for physically-separated current-carrying conductors and for physically-separated voltage-sensing conductors in cable section 5, inductance is unavoidable in that section. Let $\omega = 2\pi f$ be the angular measurement frequency, $j = \sqrt{-1}$, and let Re( ) stand for "the real part of". For a time-varying current $i_{AB}(t) = \text{Re}(\hat{I}_{AB} \cdot e^{j\omega t})$ flowing in conductors A and B, a time-varying transverse magnetic field $\underline{H}(t) = \text{Re}(\hat{\underline{H}} \cdot e^{j\omega t})$ is generated in space 35 between the two current-carrying conductors of section 5. Ampere's Law states that phasor (complex) quantities $\hat{\underline{H}}$ and $\hat{I}_{AB}$ are related by $$\oint \hat{\underline{H}} \cdot \underline{dl} = \hat{I}_{AB} \tag{1}$$

where the integral extends over any closed contour surrounding a current-carrying conductor. For an ac current entering cell/battery 10 on conductor A and leaving on conductor B, the direction of the (complex) magnetic field vector $\hat{\underline{H}}$ is as shown in FIG. 1. The transverse magnetic field therefore emerges from the plane of the conductors in space 35 of cable section 5 as is shown in FIG. 2.

Voltage-sensing conductors C and D in cable section 5 along with conducting path 90 through cell/battery 10 form a closed loop. According to Faraday's law of induction, any time-varying magnetic field linking this loop will induce a time-varying voltage into the voltage-sensing circuit. For a complex magnetic field vector $\hat{\underline{H}}$, the complex ac voltage $\hat{V}_{CD}$ induced into the voltage-sensing circuit is $$\hat{V}_{CD} = j\omega\mu_0 \oiint \hat{\underline{H}} \cdot \underline{dS} \tag{2}$$

where $\mu_0$ is the magnetic permeability of free space, and $\underline{dS}$ is a differential area vector perpendicular to a surface bounded by the closed loop.

Thus, with time-varying signals, the time-varying magnetic field formed in space 35 of cable section 5 introduces distributed coupling between the current-carrying circuit and the voltage-sensing circuit. Such spurious coupling is fundamental to the geometry of FIGS. 1 and 2 and tends to defeat the effectiveness of the Kelvin connections.

One can define the mutual inductance between the current-carrying A-B circuit and the voltage-sensing C-D circuit as follows:

$$M_{AB,CD} = \frac{\hat{V}_{CD}}{j\omega \hat{I}_{AB}} = \frac{\mu_0 \oiint \hat{\underline{H}} \cdot \underline{dS}}{\hat{I}_{AB}} \tag{3}$$

Mutual inductance $M_{AB,CD}$ is a distributed parameter—distributed over the entire length of contacting cable section 5. In any dynamic measurement, a magnetically-induced voltage $$\hat{V}_{CD} = j\omega M_{AB,CD} \hat{I}_{AB} \tag{4}$$

will be developed in the voltage-sensing circuit along with the normal ac voltage developed across cell/battery 10. Accordingly, as shown in FIG. 3, the complete cell/battery impedance measured with Kelvin connections appears externally to be $$Z_{MEAS} = Z_{BAT} + j\omega M_{AB,CD} \tag{5}$$

Distributed mutual inductance $M_{AB,CD}$ is a positive quantity that appears in series with cell/battery impedance $Z_{BAT}$. It is electrically indistinguishable from a lumped self-inductance $L_{BAT}$ internal to the battery. For sufficiently small $Z_{BAT}$ or sufficiently large $\omega$, the part of Equation (5) associated with the Kelvin cables may dominate. This fact constitutes the fundamental problem with dynamic measurements performed through Kelvin connections.

PRIOR ART

A method for reducing the influence of inductance of Kelvin cables has been taught by Bertness in U.S. Pat. No. 6,172,505. This method is depicted in FIG. 4. Y-junction 40 in FIG. 4 contains transformer 90 having primary winding 95 placed in series with current-carrying Kelvin conductor A and secondary winding 100 placed in series with voltage-sensing Kelvin conductor C. Windings 95 and 100 are wound in opposite directions on an iron core 110 so that the voltage induced into coil 100 by current flowing in coil 95 opposes the voltage normally induced into the voltage-sensing C-D circuit by current flowing in the current-carrying A-B circuit. Accordingly, transformer 90 introduces a lumped negative mutual inductance that can be adjusted to cancel the distributed positive mutual inductance inherently present in cable section 5.

Although the inductance cancellation method of FIG. 4 can be quite effective, there are several problems with its use. First of all, for a given magnetic core, the only way to change the transformer's mutual inductance is to vary the number of turns on its windings. That makes the transformer's mutual inductance a difficult quantity to adjust. Secondly, the core's hysteresis and eddy current losses introduce resistive terms into the transformer's equivalent circuit that can cause significant measurement errors. Third, the magnetic permeability of a ferromagnetic core, and hence the transformer's mutual inductance, is frequency dependent. As a result, effective cancellation of cable inductance may only occur over a fairly narrow range of frequencies. These and other problems are solved by the invention embodiments disclosed below.

SUMMARY OF THE INVENTION

A broad-band technique for canceling the distributed inductance of a four-conductor Kelvin contacting cable section comprising two spaced-apart conductor pairs with each conductor pair comprising a current-carrying conductor and a voltage-sensing conductor. A special canceling cable section, also comprising spaced-apart conductor pairs, is connected in tandem with the contacting cable section. Connections between the two cable sections are transposed such that conductors in each conductor pair of the canceling section connect to current-carrying and voltage-sensing conductors from different conductor pairs in the contacting section. The canceling section thereby exhibits a distributed negative mutual inductance that can effectively cancel the distributed positive mutual inductance of the contacting section.

In one embodiment, conductor pairs comprise pairs of insulated wires which may be twisted together. In several other disclosed embodiments, conductor pairs comprise shielded coaxial cables.

BRIEF DESCRIPTION OF THE DRAWINGS

FIG. 1 is a drawing illustrating dynamic parameter measuring apparatus connected to a cell/battery by means of Kelvin (four-point) connections.

FIG. 2 is a schematic representation showing the conductor arrangement most commonly employed with the apparatus of FIG. 1.

FIG. 3 is an equivalent circuit showing total ac impedance measured using the apparatus of FIGS. 1 and 2.

FIG. 4 is a schematic diagram depicting the method for canceling Kelvin cable inductance taught by Bertness in U.S. Pat. No. 6,172,505.

FIG. 5 is a schematic diagram depicting a method for implementing inductance cancellation in a Kelvin cable according to one embodiment of the present invention.

DETAILED DESCRIPTION OF THE ILLUSTRATIVE EMBODIMENTS

Figure 6:
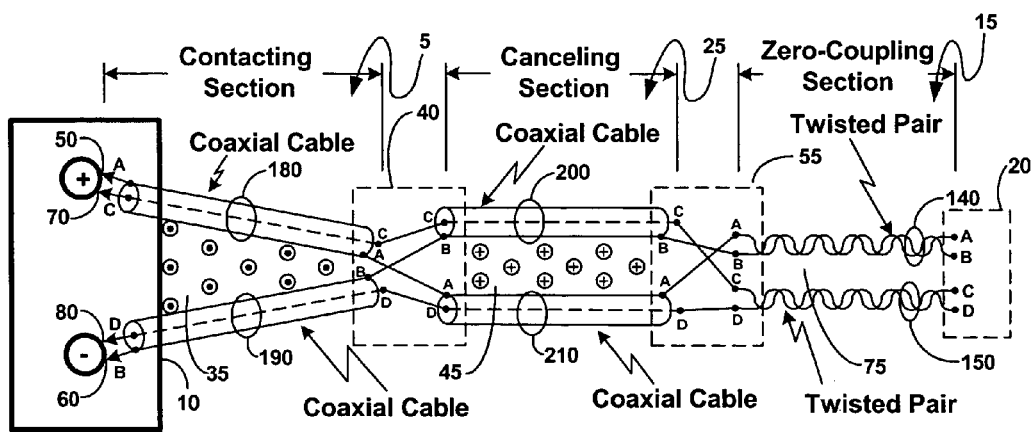
FIG. 6 is a schematic diagram depicting a method for implementing inductance cancellation in a Kelvin cable according to another embodiment of the present invention.

Consider the invention embodiment disclosed in FIG. 5. This figure depicts Kelvin connections made to battery 10 by means of a conductor arrangement similar to that of FIG. 2, but with an important modification. In FIG. 5, an additional cable section, canceling cable section 25, has been inserted in tandem between cable sections 5 and 15. Canceling cable section 25 comprises two spaced-apart conductor pairs, 160 and 170, each comprising two insulated wires which may, or may not, be twisted together. By virtue of transposed connections made in Y-junction 40 and in cable junction 55, the roles of conductor pairs in sections 5 and 15 are exactly the same as those in sections 5 and 15 of FIG. 2. Conductor pairs in section 25, however, comprise a current-carrying conductor B paired with a voltage-sensing conductor C (pair 160), and a current-carrying conductor A paired with a voltage-sensing conductor D (pair 170).

Because current-carrying conductors A and B in section 25 are transposed from those of current-carrying conductors of section 5, the direction of the magnetic field in space 45 is opposite to that of the magnetic field in space 35. Voltage-sensing conductors are, however, positioned the same in both sections. Thus, voltages induced into the voltage-sensing circuit by currents in the current-carrying circuit have opposite signs in the two sections. Section 25 therefore exhibits a negative mutual inductance that can be utilized to cancel the positive mutual inductance inherent to section 5. However, in contrast with the lumped negative mutual inductance introduced by the transformer in the prior art method of FIG. 4, the mutual inductance of section 25 is a distributed quantity.

This same distributed negative mutual inductance would occur if connections to the voltage-sensing conductors, rather than to the current-carrying conductors, were transposed in going from section 5 to section 25. A distributed negative mutual inductance in section 25 requires only that connections to two of the conductors be transposed between sections 5 and 25 such that a voltage-sensing conductor from one conductor pair of section 5 is paired with a current-carrying conductor from the other conductor pair of section 5, and vice-versa.

The distributed negative mutual inductance introduced by this method is a very broad-band property that is essentially loss-free over a wide range of frequencies. These are very desirable advantages over the prior-art method of producing lumped negative mutual inductance depicted in FIG. 4. The distributed negative mutual inductance of the FIG. 5 embodiment can be varied by changing either the length of cable section 25 or the spacing between conductor pairs 160 and 170. Therefore, the mutual inductance of a Kelvin cable of the type depicted in FIG. 5 is fairly easy to "tune" experimentally. One disadvantage of the embodiment depicted in FIG. 5, however, is that its insulated-wire geometry is not very amenable to exact mathematical analysis.

Figure 7:
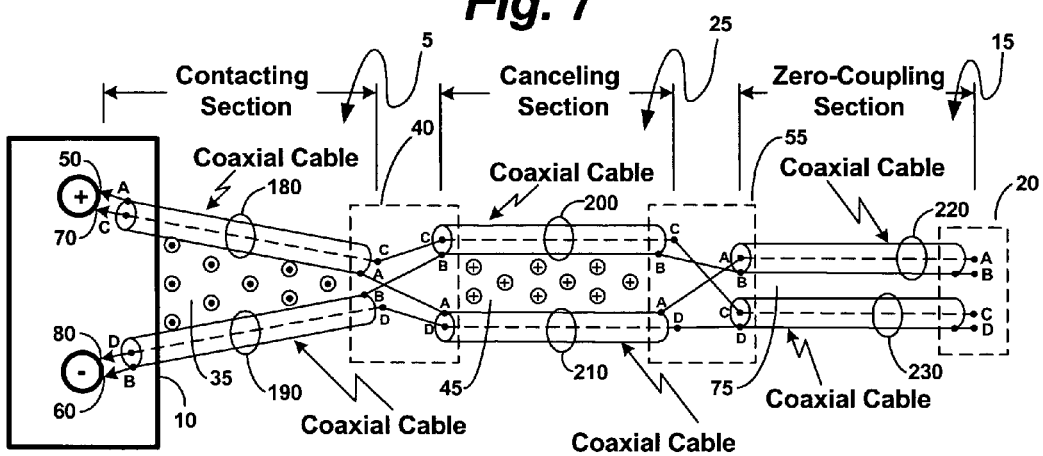
FIG. 7 is a schematic diagram depicting a method for implementing inductance cancellation in a Kelvin cable according to still another embodiment of the present invention.

FIGS. 6 and 7 disclose invention embodiments that are amenable to exact mathematical analyses and therefore do not require experimental "tuning". With both of these embodiments, the insulated-wire conductor pairs of cable sections 5 and 25 of FIG. 5 have been replaced by shielded coaxial cables.

In cable section 5 of FIGS. 6 and 7, a coaxial cable 180 replaces conductor pair 120 and couples to the positive terminal of cell/battery 10 at contact points 50 and 70, while a coaxial cable 190 replaces conductor pair 130 and couples to the negative terminal of cell/battery 10 at contact points 60 and 80. With the coaxial cables depicted, cable shields comprise the current-carrying conductors, A and B, and center conductors comprise the voltage-sensing conductors, C and D. However, the reciprocity theorem reveals that the distributed mutual inductance of section 5 will be unchanged by interchanging the roles of coaxial cable shields and center conductors. Therefore, the selection shown in FIGS. 6 and 7 is simply a matter of choice.

In cable section 25 of FIGS. 6 and 7, coaxial cable 200 replaces conductor pair 160 and coaxial cable 210 replaces conductor pair 170. Again, with the coaxial cables depicted, cable shields comprise current-carrying conductors A and B and center conductors comprise voltage-sensing conductors C and D. Again this selection is simply a matter of choice since the reciprocity theorem likewise reveals that the distributed mutual inductance of section 25 is unaffected by interchanging roles of the coaxial shields and center conductors.

In the embodiment of FIG. 7, the conductor pairs in zero-coupling cable section 15 have also been replaced by shielded coaxial cables. However, in the FIG. 6 embodiment, they remain twisted pairs as in the embodiment of FIG. 5. Either of these choices provides negligible coupling between current-carrying conductors and voltage-sensing conductors in cable section 15. Therefore, the selection of one of these two embodiments over the other is simply a matter of choice.

Figure 8:
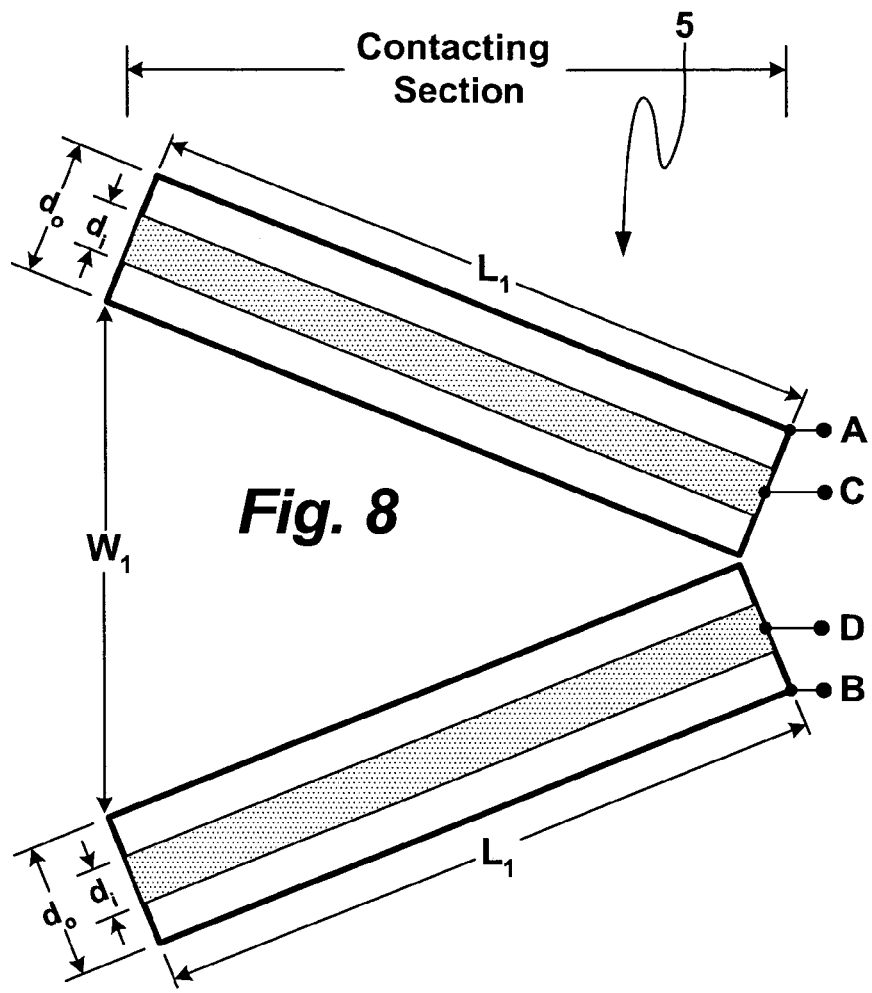
FIG. 8 is a plan drawing showing the dimensions of shielded coaxial conductors comprising the conductor pairs in cable section 5 of the Kelvin cables depicted in FIGS. 6 and 7.

FIG. 8 is a plan drawing defining dimensions of the shielded coaxial cables that comprise conductors in contacting cable section 5 of the invention embodiments depicted in FIGS. 6 and 7. One sees that section 5 comprises two coplanar coaxial cables having radii $d_i$ of their inner conductors, radii $d_o$ of their outer conductors, lengths $L_1$, and separated at the cell/battery terminals by a distance $W_1$. The distributed mutual inductance of this geometry can be determined exactly from Maxwell's equations. The result is $$M_1 = \left(\frac{\mu_0 \cdot L_1}{\pi}\right) \cdot \left\{ \left(1 + \frac{\left(\frac{2 \cdot L_1}{W_1}\right) \cdot \left(\frac{d_0}{4 \cdot L_1}\right)}{\sqrt{1 - \left(\frac{W_1}{2 \cdot L_1}\right)^2}}\right) \cdot \ln\left[1 + \frac{\sqrt{1 - \left(\frac{W_1}{2 \cdot L_1}\right)^2}}{\left(\frac{2 \cdot L_1}{W_1}\right) \cdot \left(\frac{d_0}{4 \cdot L_1}\right)}\right] - 1 \right\} \quad (6)$$

Note that $M_1$ is unaffected by the coax cables' center-conductor diameter $d_i$.

Figure 9:
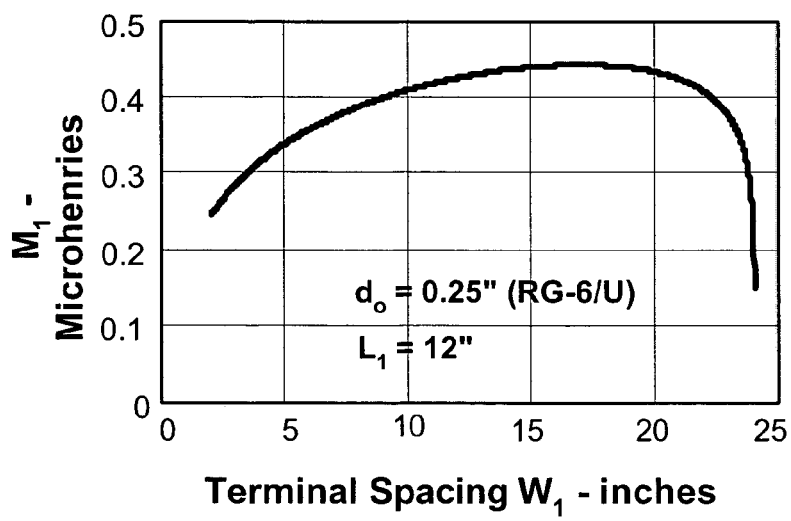
FIG. 9 is a calculated plot of distributed mutual inductance $M_1$ as a function of conductor separation $W_1$ at the cell/battery terminals for the shielded coaxial conductors of the cable section 5 illustrated in FIG. 8.

FIG. 9 shows a plot of distributed mutual inductance $M_1$ calculated from Equation (6) by assuming that section 5 comprises two 12-inch (30.48 cm) lengths of conventional RG-6/U coaxial cable ($d_o$=0.25") (6.35 mm). One notes that $M_1$ varies quite gradually with $W_1$ over most of the range of $W_1$. However, as $W_1$ approaches its maximum value of 24 inches (60.96 cm), mutual inductance $M_1$ drops precipitously to zero.

Figure 10:
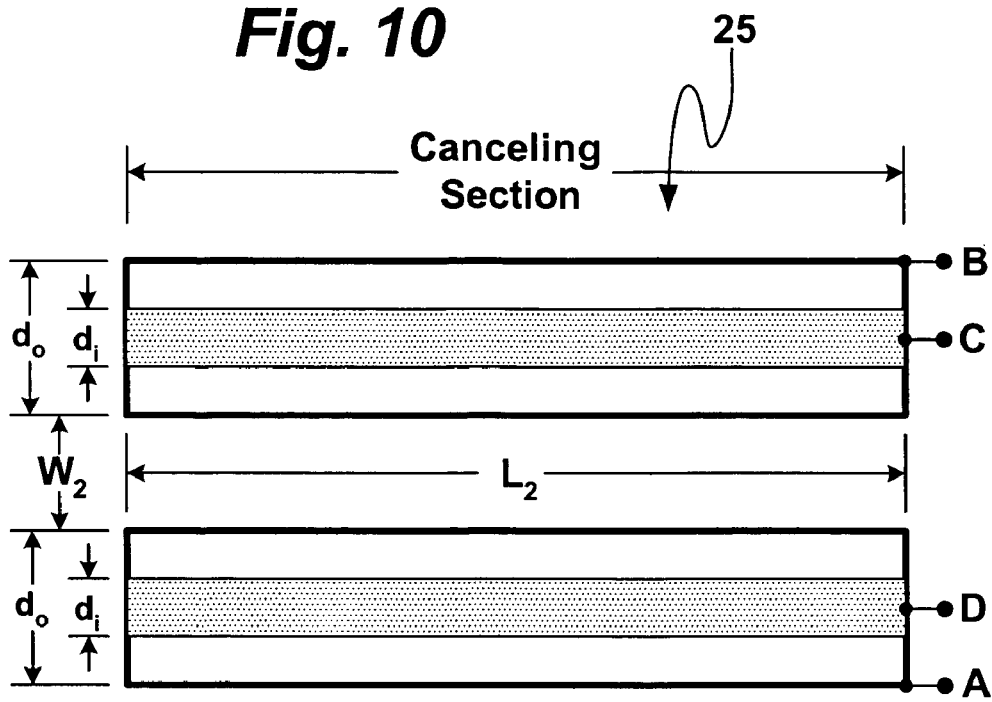
FIG. 10 is a plan drawing showing the dimensions of parallel shielded coaxial conductors comprising the conductor pairs in cable section 25 of the Kelvin cables depicted in FIGS. 6 and 7.

FIG. 10 is a plan drawing defining the dimensions of the shielded coaxial conductors comprising conductors in canceling cable section 25 of the Kelvin cables depicted in FIGS. 6 and 7. One observes two parallel coaxial cables having radii $d_i$ of their inner conductors, radii $d_o$ of their outer conductors, lengths $L_2$, and uniformly separated by distance $W_2$. The distributed mutual inductance of this geometry can likewise be determined exactly from Maxwell's equations. The result is $$M_2 = \left(\frac{-\mu_0 \cdot L_2}{\pi}\right) \cdot \ln\left(1 + \frac{2 \cdot W_2}{d_0}\right) \quad (7)$$

Note that $M_2$ is likewise unaffected by the coax cables' center-conductor diameter $d_i$.

Figure 11:
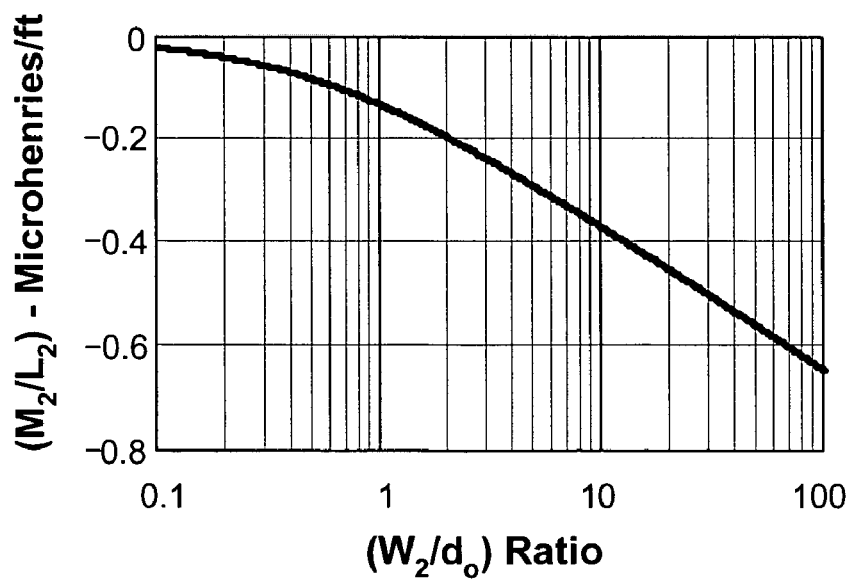
FIG. 11 is a calculated plot of normalized distributed mutual inductance $(M_2/L_2)$ as a function of normalized conductor separation $(W_2/d_o)$ for the parallel shielded coaxial conductors of the cable section 25 illustrated in FIG. 10.

FIG. 11 is a plot of normalized distributed mutual inductance $(M_2/L_2)$ as a function of normalized conductor separation $(W_2/d_o)$ calculated from Equation (7). One sees that $(M_2/L_2)$ decreases logarithmically as $(W_2/d_o)$ increases linearly throughout most of the range plotted.

One can utilize equations (6) and (7) to design broadband low-inductance Kelvin cables of the type disclosed in FIGS. 6 and 7. As a design example, consider test leads in section 5 comprising a pair of two 12" (30.48 cm) lengths of RG-6/U coaxial cable. Equation (6) predicts that the distributed mutual inductance of this section will be $M_1$=0.39±0.05 µH over the range $5" \leq W_1 \leq 23.5"$. According to equation (7), one can realize a negative mutual inductance $M_2$=−0.39 µH with a section 25 length $L_2$=17.46" (44.35 cm) of parallel RG-6/U cables separated by distance $W_2$=1" (2.54 cm). Thus, the tandem combination of these two sections would result in a broadband low-inductance Kelvin cable having total mutual inductance $|M_1+M_2| \leq 0.05$ µH over the entire range $5" \leq W_1 23.5"$. This value represents a minimum decrease in mutual inductance of nearly an order of magnitude.

The invention embodiments illustrated in FIGS. 5, 6, and 7 all depict a canceling cable section 25, inserted between a contacting cable section 5, and a zero-coupling cable section 15. It should be made clear, however, that the order of this tandem arrangement is somewhat arbitrary. The canceling cable section 25 could just as well be placed after the zero-coupling cable section in the cascade rather than before it. Furthermore, zero-coupling section 15 is only employed to make the total cable length convenient. In many cases, a zero-coupling section 15 may not be necessary at all.

Moreover, the invention is not limited to the particular geometries and examples disclosed herein. For instance, pairs of shielded coaxial cables and of twisted insulated wires have both been disclosed in illustrative examples of canceling cable sections. However, other passive transmission-line geometries such as elliptical lines, open-wire lines, strip-lines, microstrip lines, etc, can just as well be employed. Furthermore, distributed negative mutual inductance can also be obtained from a spatial distribution of either passive or active elements. Other means for implementing a distributed negative mutual inductance section will be apparent to those skilled in the art, and our invention includes any such section obtained by any means whatsoever inserted in tandem with a Kelvin connecting cable. Workers skilled in the art will recognize that these and other variations may be made in form and detail without departing from the true spirit and scope of our invention.

What is claimed is:

1. A low-inductance cable for implementing Kelvin connections to positive and negative terminals of an electrochemical cell or battery comprising:
    a first cable section adapted to couple to a positive terminal with a first current-carrying conductor and a first voltage sensing conductor and to couple to a negative terminal with a second current-carrying conductor and a second voltage-sensing conductor, said second current-carrying and voltage-sensing conductors spaced apart from said first current-carrying and voltage-sensing conductors,
    a second cable section comprising a third current-carrying conductor, a third voltage-sensing conductor, a fourth current-carrying conductor, and a fourth voltage-sensing conductor, said fourth current-carrying and voltage sensing conductors spaced apart from said third current-carrying and voltage-sensing conductors; and,
    a cable junction interposed between said first cable section and said second cable section, said cable junction transposing connections by interconnecting said first and fourth current-carrying conductors, said second and third current-carrying conductors, said first and third voltage-sensing conductors, and said second and fourth voltage-sensing conductors.

2. The low-inductance cable of claim 1 wherein said first current-carrying and voltage-sensing conductors, said second current-carrying and voltage-sensing conductors, said third current-carrying and voltage-sensing conductors, and said fourth current-carrying and voltage-sensing conductors comprise four pairs of insulated wires.

3. The low-inductance cable of claim 2 wherein wires of each said pair are twisted together.

4. The low-inductance cable of claim 1 wherein said first current-carrying and voltage-sensing conductors, said second current-carrying and voltage-sensing conductors, said third current-carrying and voltage-sensing conductors, and said fourth current-carrying and voltage-sensing conductors comprise four shielded coaxial cables.

5. The low-inductance cable of claim 4 wherein current-carrying and voltage-sensing conductors of said first cable section couple through a distributed mutual inductance given by equation (6)

$$M_1 = \left(\frac{\mu_0 \cdot L_1}{\pi}\right) \cdot \left\{ \left(1 + \frac{\left(\frac{2 \cdot L_1}{W_1}\right) \cdot \left(\frac{d_o}{4 \cdot L_1}\right)}{\sqrt{1 - \left(\frac{W_1}{2 \cdot L_1}\right)^2}}\right) \cdot \ln\left(1 + \frac{\sqrt{1 - \left(\frac{W_1}{2 \cdot L_1}\right)^2}}{\left(\frac{2 \cdot L_1}{W_1}\right) \cdot \left(\frac{d_o}{4 \cdot L_1}\right)}\right) - 1 \right\}$$

and current-carrying and voltage-sensing conductors of said second cable section couple through a distributed mutual inductance given by equation (7)

$$M_2 = \left(\frac{-\mu_0 \cdot L_2}{\pi}\right) \cdot \ln\left(1 + \frac{2 \cdot W_2}{d_o}\right).$$

6. A connecting cable for providing Kelvin connections to a positive terminal and a negative terminal of an electrochemical cell or battery comprising:
    a first cable section adapted to couple to said positive terminal with first and second conductors and to couple to said negative terminal with third and fourth conductors, said third and fourth conductors spaced apart from said first and second conductors,
    a second cable section comprising fifth, sixth, seventh, and eighth conductors, said seventh and eighth conductors spaced apart from said fifth and sixth conductors,
    a third cable section comprising ninth, tenth, eleventh, and twelfth conductors, said eleventh and twelfth conductors spaced apart from said ninth and tenth conductors,
    a first cable junction interposed between said first cable section and said second cable section, said first cable junction transposing connections by interconnecting said first and eighth conductors, said second and sixth conductors, said third and seventh conductors, and said fourth and fifth conductors; and
    a second cable junction interposed between said second cable section and, said third cable section, said second cable junction transposing connections by interconnecting said fifth and tenth conductors, said sixth and eleventh conductors, said seventh and twelfth conductors, and said eighth and ninth conductors.

7. The connecting cable of claim 6 wherein said first and second conductors, said third and fourth conductors, said fifth and sixth conductors, and said seventh and eighth conductors comprise four pairs of insulated wires.

8. The connecting cable of claim 7 wherein insulated wires of each said pair are twisted together.

9. The connecting cable of claim 6 wherein said first and second conductors, said third and fourth conductors, said fifth and sixth conductors, and said seventh and eighth conductors comprise conductors of four shielded coaxial cables.

10. The connecting cable of claim 6 wherein said ninth and tenth conductors and said eleventh and twelfth conductors comprise two pairs of twisted insulated wires.

11. The connecting cable of claim 6 wherein said ninth and tenth conductors and said eleventh and twelfth conductors comprise conductors of two shielded coaxial cables.

12. The connecting cable of claim 9 wherein coaxial cable shields couple to coaxial cable center conductors through distributed mutual inductances given by equation (6)

$$M_1 = \left(\frac{\mu_0 \cdot L_1}{\pi}\right) \cdot \left\{ \left( 1 + \frac{\left(\frac{2 \cdot L_1}{W_1}\right) \cdot \left(\frac{d_o}{4 \cdot L_1}\right)}{\sqrt{1 - \left(\frac{W_1}{2 \cdot L_1}\right)^2}} \right) \cdot \ln\left( 1 + \frac{\sqrt{1 - \left(\frac{W_1}{2 \cdot L_1}\right)^2}}{\left(\frac{2 \cdot L_1}{W_1}\right) \cdot \left(\frac{d_o}{4 \cdot L_1}\right)} \right) - 1 \right\}$$

in cable section 1 and by equation (7)

$$M_2 = \left(\frac{-\mu_0 \cdot L_2}{\pi}\right) \cdot \ln\left(1 + \frac{2 \cdot W_2}{d_o}\right).$$

in cable section 2.

13. The connecting cable of claim 11 wherein coaxial cable shields couple to coaxial cable center conductors through distributed mutual inductance given by equation (7)

$$M_2 = \left(\frac{-\mu_0 \cdot L_2}{\pi}\right) \cdot \ln\left(1 + \frac{2 \cdot W_2}{d_o}\right).$$

14. A cable for implementing Kelvin connections to first and second terminals of an electrochemical cell or battery comprising:
- a first cable section adapted to couple to said first terminal with a conductor pair comprising a current-carrying conductor and a voltage-sensing conductor and to couple to said second terminal with another conductor pair comprising a current-carrying conductor and a voltage-sensing conductor,
- a second cable section comprising two spaced-apart conductor pairs, each said pair comprising a current-carrying conductor and a voltage-sensing conductor; and,
- a cable junction interconnecting conductors of said first and second cable sections, said cable junction transposing connections such that conductors in each pair in said first cable section couple to conductors in different pairs in said second cable section.

15. The cable of claim 14 wherein said conductor pairs in said first and second cable sections comprise pairs of insulated wires.

16. The cable of claim 15 wherein insulated wires of each said pair are twisted together.

17. The cable of claim 14 wherein said conductor pairs in said first and second cable sections comprise shielded coaxial cables.

18. The cable of claim 17 wherein current-carrying conductors couple to voltage-sensing conductors in said first cable section through distributed mutual inductance given by equation (6)

$$M_1 = \left(\frac{\mu_0 \cdot L_1}{\pi}\right) \cdot \left\{ \left( 1 + \frac{\left(\frac{2 \cdot L_1}{W_1}\right) \cdot \left(\frac{d_o}{4 \cdot L_1}\right)}{\sqrt{1 - \left(\frac{W_1}{2 \cdot L_1}\right)^2}} \right) \cdot \ln\left( 1 + \frac{\sqrt{1 - \left(\frac{W_1}{2 \cdot L_1}\right)^2}}{\left(\frac{2 \cdot L_1}{W_1}\right) \cdot \left(\frac{d_o}{4 \cdot L_1}\right)} \right) - 1 \right\}$$

and current-carrying conductors couple to voltage-sensing conductors in said second cable section through distributed mutual inductance given by equation (7)

$$M_2 = \left(\frac{-\mu_0 \cdot L_2}{\pi}\right) \cdot \ln\left(1 + \frac{2 \cdot W_2}{d_o}\right).$$

19. A low-inductance cable for implementing Kelvin connections to first and second terminals of an electrochemical cell or battery comprising:
- a first cable section adapted to couple to said first terminal with one pair of conductors and to couple to said second terminal with another pair of conductors,
- a second cable section comprising two spaced-apart pairs of conductors,
- a third cable section comprising two spaced-apart pairs of conductors,
- a first cable junction interconnecting conductors of said first and second cable sections, said first cable junction transposing connections such that conductors in each pair in said first cable section couple to conductors in different pairs in said second cable section; and,
- a second cable junction interconnecting conductors of said second and third cable sections, said second cable junction transposing connections such that conductors in each pair in said second cable section couple to conductors in different pairs in said third cable section.

20. The low-inductance cable of claim 19 wherein said pairs of conductors in said first and second cable sections comprise pairs of insulated wires.

21. The low-inductance cable of claim 20 wherein wires in each said pair are twisted together.

22. The low-inductance cable of claim 19 wherein said pairs of conductors in said first and second cable sections comprise shielded coaxial cables.

23. The low-inductance cable of claim 19 wherein said pairs of conductors in said third cable section comprise pairs of insulated wires twisted together.

24. The low-inductance cable of claim 19 wherein said pairs of conductors in said third cable section comprise shielded coaxial cables.

25. The low-inductance cable of claim 22 wherein mutual inductance coupling between coaxial cable shields and center-conductors is given by equation (6)

$$M_1 = \left(\frac{\mu_0 \cdot L_1}{\pi}\right) \cdot \left\{ \left( 1 + \frac{\left(\frac{2 \cdot L_1}{W_1}\right) \cdot \left(\frac{d_o}{4 \cdot L_1}\right)}{\sqrt{1 - \left(\frac{W_1}{2 \cdot L_1}\right)^2}} \right) \cdot \ln\left( 1 + \frac{\sqrt{1 - \left(\frac{W_1}{2 \cdot L_1}\right)^2}}{\left(\frac{2 \cdot L_1}{W_1}\right) \cdot \left(\frac{d_o}{4 \cdot L_1}\right)} \right) - 1 \right\}$$

in said first section and by equation (7)

$$M_2 = \left(\frac{-\mu_0 \cdot L_2}{\pi}\right) \cdot \ln\left(1 + \frac{2 \cdot W_2}{d_o}\right).$$

in said second section.

26. The low-inductance cable of claim 24 wherein mutual inductance coupling between coaxial cable shields and center-conductors is given by equations (7)

$$M_2 = \left(\frac{-\mu_0 \cdot L_2}{\pi}\right) \cdot \ln\left(1 + \frac{2 \cdot W_2}{d_o}\right).$$

in said third section.

* * * * *